(12) United States Patent
Yu et al.

(10) Patent No.: US 11,322,623 B2
(45) Date of Patent: May 3, 2022

(54) NON-VOLATILE MEMORY STRUCTURE AND METHOD OF MANUFACTURING THE SAME

(71) Applicant: Winbond Electronics Corp., Taichung (TW)

(72) Inventors: Ping-Lung Yu, Hsinchu (TW); Po-Chun Shao, Hsinchu (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 17/037,432

(22) Filed: Sep. 29, 2020

(65) Prior Publication Data

US 2022/0102546 A1    Mar. 31, 2022

(51) Int. Cl.
| | | |
|---|---|---|
| H01L 29/788 | (2006.01) | |
| H01L 29/66 | (2006.01) | |
| H01L 29/423 | (2006.01) | |

(52) U.S. Cl.
CPC ...... *H01L 29/788* (2013.01); *H01L 29/42324* (2013.01); *H01L 29/66825* (2013.01)

(58) Field of Classification Search
CPC .................. H01L 29/788; H01L 29/66825
See application file for complete search history.

(56) References Cited

U.S. PATENT DOCUMENTS

| | | | | |
|---|---|---|---|---|
| 5,734,607 A | * | 3/1998 | Sung ............... | H01L 27/11521 257/314 |
| 6,917,072 B2 | * | 7/2005 | Noguchi ............ | H01L 27/115 257/324 |
| 7,045,849 B2 | * | 5/2006 | Chen ............... | H01L 27/115 257/314 |
| 7,629,213 B2 | * | 12/2009 | Cho ................ | H01L 27/115 257/314 |
| 7,705,392 B2 | * | 4/2010 | Yonemochi ....... | H01L 27/11521 257/315 |
| 8,541,284 B2 | * | 9/2013 | Sim ................. | H01L 21/76229 438/421 |

(Continued)

FOREIGN PATENT DOCUMENTS

| | | |
|---|---|---|
| CN | 109994478 A | 7/2019 |
| CN | 110211959 A | 9/2019 |
| KR | 100843044 B1 | 7/2008 |

*Primary Examiner* — Eugene Lee
(74) *Attorney, Agent, or Firm* — Muncy, Geissler, Olds & Lowe, P.C.

(57) ABSTRACT

A non-volatile memory structure includes a substrate, a tunnel dielectric layer on the substrate, and several separate gate structures on the substrate. The gate structures are disposed within an array region of the substrate. Each gate structure includes a floating gate and a control gate on the floating gate. A first dielectric layer is formed above the substrate and covers the top surface of the tunnel dielectric layer. The first dielectric layer also covers the side surfaces and the top surface of each gate structure. Gaps between portions of the first dielectric layer on the side surfaces of two adjacent gate structures are fully filled with the air to form air gaps. Several insulating blocks are formed on the first dielectric layer, and they correspond to the gate structures. A second dielectric layer is formed on the insulating blocks and covers the insulating blocks and the air gaps.

14 Claims, 8 Drawing Sheets

(56) References Cited

U.S. PATENT DOCUMENTS

| | | | | |
|---|---|---|---|---|
| 8,822,303 | B2* | 9/2014 | Chen | H01L 21/764 |
| | | | | 438/421 |
| 9,209,275 | B1* | 12/2015 | Zou | H01L 29/7881 |
| 9,728,604 | B2* | 8/2017 | Kim | H01L 23/53295 |
| 10,355,006 | B2* | 7/2019 | Fujitsuka | H01L 27/11582 |
| 2009/0001444 | A1* | 1/2009 | Matsuoka | H01L 27/11521 |
| | | | | 257/316 |
| 2009/0267131 | A1* | 10/2009 | Nitta | H01L 27/11524 |
| | | | | 257/316 |
| 2011/0303967 | A1* | 12/2011 | Harari | H01L 27/11568 |
| | | | | 257/321 |
| 2011/0309430 | A1* | 12/2011 | Purayath | H01L 27/11524 |
| | | | | 257/321 |
| 2012/0007165 | A1* | 1/2012 | Lee | H01L 29/40114 |
| | | | | 257/316 |
| 2012/0280300 | A1* | 11/2012 | Kim | H01L 27/11524 |
| | | | | 257/315 |
| 2014/0319594 | A1* | 10/2014 | Matsuda | H01L 29/40114 |
| | | | | 257/316 |
| 2015/0028409 | A1* | 1/2015 | Kuge | H01L 27/11524 |
| | | | | 257/316 |
| 2015/0060986 | A1 | 3/2015 | Fujitsuka et al. | |
| 2021/0296486 | A1* | 9/2021 | Chen | H01L 29/40114 |

* cited by examiner

NON-VOLATILE MEMORY STRUCTURE AND METHOD OF MANUFACTURING THE SAME

BACKGROUND

Field of the Disclosure

The present disclosure relates to a non-volatile memory structure and a method of manufacturing the same, and in particular, it relates to a non-volatile memory structure having uniform air gaps with the same height and a method of manufacturing the same.

Description of the Related Art

Non-volatile memory structures can be categorized into two types, according to their write mechanism: read-only memory (ROM) and flash memory. Categorization is dependent upon whether the data in the memory can be rewritten at any time. Although flash memory does not offer arbitrary random-access rewrite or erase operations, it offers random-access read and programming operations. Also, flash memory costs much less than read-only memory and had become the dominant memory type wherever a system required a significant amount of non-volatile solid-state storage.

In general, a flash memory contains two gates. One gate is a floating gate for storing data, and the other gate is a control gate for input and output of data. The floating gate is positioned under the control gate and is in a "floating" state. The so-called "floating" means that this gate is surrounded and isolated with an insulating material to prevent loss of charge. The control gate is electrically connected to the word line to control the device. One of the advantages of flash memory is that one or more selected blocks or sections can be entirely erased. Flash memory is widely used in enterprise servers, storage and networking technologies, and a variety of consumer electronics, such as universal serial bus (USB) flash drives, mobile phones, digital cameras, tablets, personal computer memory cards for laptops and embedded controllers.

In the current non-volatile memory, the air gaps formed between adjacent control gates are not uniform in height and contour, thereby affecting the stability of the electrical performance of the memory. Also, in the current non-volatile memory, the heights of the air gaps are lower than the top surfaces of the control gates, so that a dielectric layer (such as an oxide layer) deposited on the control gates also fills in the parts of the spaces between adjacent control gates. In other words, in addition to the beside the air gaps formed between the adjacent control gates, the dielectric material of the dielectric layer will also exist between the adjacent control gates, which causes the problem of current leakage. Accordingly, the electrical performance of the non-volatile memory will be deteriorated and the reliability of the non-volatile memory will be decreased.

Although existing non-volatile memory structures and methods of manufacturing the same have generally been adequate for their intended purposes, they have not been entirely satisfactory in all respects. There are still some problems to be overcome in regards to the memory structures and its manufacturing methods.

SUMMARY

In some embodiments of the disclosure, a non-volatile memory structure is provided. The non-volatile memory structure includes a substrate having an array region; a tunnel dielectric layer on the substrate; and several gate structures over the array region of the substrate. The gate structures are separate from each other. Also, each of the gate structures includes a floating gate and a control gate above the floating gate. In some embodiments, the non-volatile memory structure also includes the first dielectric layer formed above the substrate and covering the top surface of the tunnel dielectric layer, wherein the first dielectric layer covers the side surfaces and the top surfaces of the gate structures. Also, spaces between the portions of the first dielectric layer on the side surfaces of two adjacent gate structures are fully filled with the air to form respective air gaps. In some embodiments, the non-volatile memory structure further includes several insulating blocks above the first dielectric layer, wherein each of the insulating blocks corresponds to one of the gate structures. The non-volatile memory structure further includes a second dielectric layer on the insulating blocks, wherein the second dielectric layer covers the insulating blocks and the air gaps.

In some embodiments of the disclosure, a method of manufacturing a non-volatile memory structure is provided. The method includes providing a substrate and forming a tunnel dielectric layer on the substrate, wherein the substrate has the first region and the second region. In some embodiments, the method also includes forming several first stacked structures and several second stacked structures separately above the tunnel dielectric layer, wherein the first stacked structures and the second stacked structures are formed in the first region and the second region, respectively. In some embodiments, the method also includes forming the first dielectric layer above the substrate, wherein the first dielectric layer covers the top surface of the tunnel dielectric layer. Also, the first dielectric layer covers the side surfaces and the top surfaces of the first stacked structures and the second stacked structures. In some embodiments, the method further includes forming several insulating blocks above the first dielectric layer, wherein the insulating blocks are formed over the top surfaces of the first stacked structures and the second stacked structures. In some embodiments, the method further includes forming a second dielectric layer over the first stacked structures and the second stacked structures to form air gaps, wherein the second dielectric layer covers the insulating blocks and the air gaps. In some embodiments, spaces between every two portions of the first dielectric layer on the side surfaces of two adjacent first stacked structures are fully filled with the air to form the air gaps.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Some embodiments are described below. Throughout the various views and illustrative embodiments, similar reference numbers are used to designate similar features/components.

The non-volatile memory structures provided in some embodiments of the present disclosure can be different types of non-volatile memory structures. For example, the structures and manufacturing methods in accordance with some embodiments of the present disclosure can be applied to any memory structure including floating gates. A non-volatile memory structure includes several stacked structures. In one embodiment, several first stacked structures and second stacked structures are disposed over the first region (such as an array region, or an active region) and the second region (such as a peripheral region) of the substrate, respectively. A dielectric layer covers the tops surfaces and side surfaces of the aforementioned stacked structures. Each of the stacked structures includes a floating gate over the substrate, a control gate and an inter-gate dielectric layer between the floating gate and the control gate. According to some embodiments of the present disclosure, the air gaps with uniform height are formed in the spaces between the dielectric layer on the side surfaces of adjacent first stacked structures. In some embodiments, the spaces (or the gaps) between every two portions of the dielectric layer on the respective side surfaces of every two adjacent first stacked structures are fully filled with the air to form those air gaps. Also, those air gaps have sufficient widths to expose the dielectric layer covering the side surfaces of adjacent first stacked structures. The details of the manufacturing methods and the forming structures of some embodiments are provided in the following descriptions. In addition, three of the first stacked structures and one of the second stacked structures over the respective first region and the second region of the substrate are depicted in the diagrams, for the sake of simplicity and clarity. Also, the air gaps extending in the spaces between adjacent first stacked structures are depicted in the diagrams for illustrating the non-volatile memory structures of some embodiments.

Figure 1A:
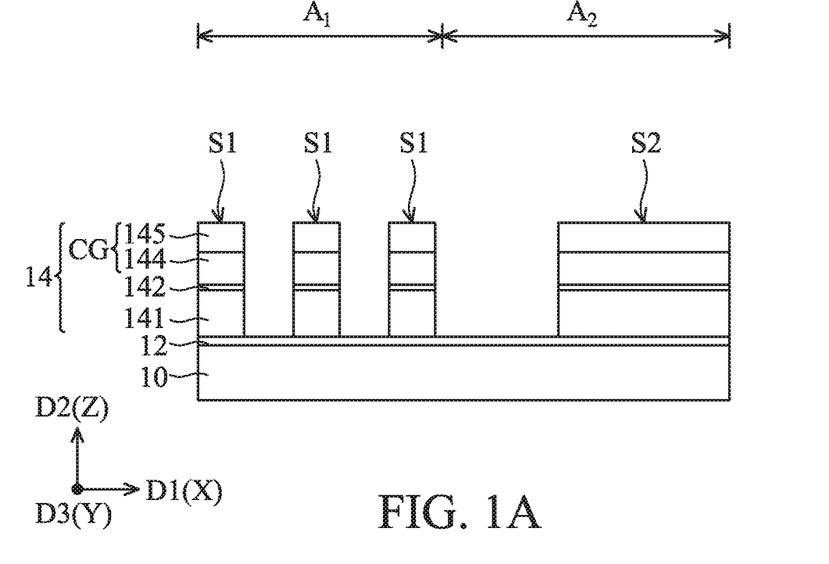
FIG. 1A-FIG. 1I are cross-sectional views of various stages of manufacturing a non-volatile memory structure in accordance with some embodiments of the present invention.

FIG. 1A-FIG. 1I are cross-sectional views of various stages of manufacturing a non-volatile memory structure in accordance with some embodiments of the present invention. Referring to FIG. 1A, a substrate 10 is provided, and a tunnel dielectric layer 12 is formed on the substrate 10. The substrate 10 includes a first region (such as an array region) A1 and a second region (such as a peripheral region) $A_2$. In some embodiments, the substrate 10 may include silicon, gallium arsenide, gallium nitride, germanium silicide, a silicon-on-insulator (SOI), another suitable substrate material, or a combination thereof. In some embodiments, the tunnel dielectric layer 12 may include silicon oxide or another high-k dielectric material (with a dielectric constant greater than 4). For example, the high-k dielectric material may include hafnium oxide, hafnium silicon oxide, hafnium aluminum oxide, or hafnium tantalum oxide. In some embodiments, the thickness of the tunnel dielectric layer 12 is in a range of about 3 nm to about 10 nm.

Referring again to FIG. 1A, several stacked structures are formed on the tunnel dielectric layer 12. For example, the stacked structures S1 and S2 are formed in the first region A1 and the second region A2, respectively. Also, the stacked structures S1 and S2 are spaced apart from each other in the direction D1 (such as X-direction). Each of the stacked structures S1 and S2 may include two or more than two of material layers stacked vertically in the direction D2 (such as Z-direction). Those material layers of the stacked structures S1 and S2 may extend in the direction D3 (such as Y-direction).

In some embodiments, those stacked structures S1 also be referred to as gate structures 14 in the array region of the substrate. Each of the gate structures includes a floating gate 141, an inter-gate dielectric layer 142 and a control gate CG. The floating gate 141 is formed on the tunnel dielectric layer 12, and the control gate CG is formed over the floating gate 141. Also, the inter-gate dielectric layer 142 is positioned between the floating gate 141 and the control gate CG.

In some embodiments, the floating gate 141 includes polysilicon. The inter-gate dielectric layer 142 can be a single layer structure or a multilayer structure. In some embodiments, the inter-gate dielectric layer 142 includes silicon oxide, silicon nitride, or a combination thereof. For example, the inter-gate dielectric layer 142 may be an oxide-nitride-oxide (ONO) structure, or an oxide-nitride-oxide-nitride-oxide (ONONO) structure. Also, the control gate CG can be a single layer structure or a multilayer structure. In some embodiments, the control gate CG includes polysilicon, metal, metal silicide or other conductive materials. For example, metal may include titanium (Ti), tantalum (Ta), tungsten (W), aluminum (Al), zirconium (Zr), or a combination thereof. Metal silicide may include nickel silicide, titanium silicide, tungsten silicide, or cobalt silicide. In this embodiment, the control gate CG includes a polysilicon gate 144 and a metal gate 145 on the polysilicon gate 144. The metal gate 145 may include a metal silicide, such as cobalt silicide. Additionally, in this embodiment, the stacked structure S2 includes a stack of the material layers that are the same as the material layers of the stacked structure S1. The details of the material layers for forming the stacked structure S2 will not be redundantly repeated herein.

Figure 1B:
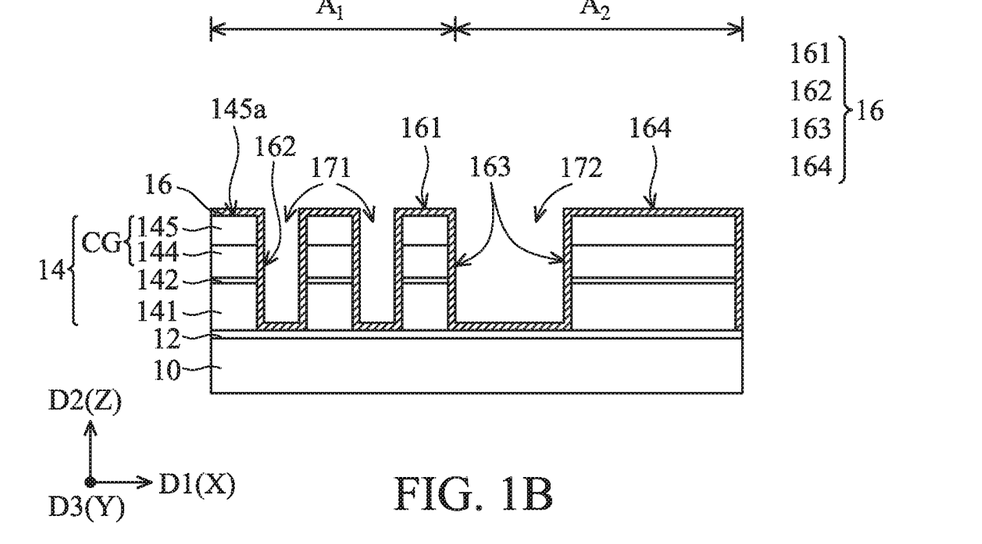

Referring to FIG. 1B, a dielectric layer 16 is formed above the substrate 10 and covers the top surface of the tunnel dielectric layer 12. The dielectric layer 16 also covers the side surfaces and the top surfaces of the stacked structures S1 and S2. In this embodiment, the dielectric layer 16 includes the first portions 161, the second portions 162, the third portions 163 and the fourth portions 164. As shown in FIG. 1B, the first portions 161 are formed on the top surfaces of the stacked structures S1 (such as the top surfaces 145a of the metal gate 145). The second portions 162 are formed between adjacent stacked structures S1. The third portions 163 are formed between adjacent stacked structures S2. The fourth portions 164 are formed on the top surfaces of the stacked structures S2. In some embodiments, the second portions 162 between adjacent stacked structures S1 are formed as liners, and the third portions 163 between adjacent stacked structures S2 are also formed as liners. As shown in FIG. 1B, the second portions 162 covers the side surfaces of the floating gate 141, the side surfaces of the inter-gate dielectric layer 142 and the side surfaces of the control gate CG (including the polysilicon gate 144 and the metal gate 145). In addition, in some embodiments, the dielectric layer 16 is a nitride layer, such as a silicon nitride layer.

As shown in FIG. 1B, after the dielectric layer 16 is formed, there are first trenches 171 between adjacent stacked structures S1 and the second trenches 172 between adjacent stacked structures S1 and S2. In one embodiment, the stacked structures S1 are formed in an array region (e.g. the first region $A_1$ described above) of the substrate 10, and the stacked structures S2 are formed in a peripheral region (e.g.

the second region A2 described above) of the substrate 10. Compared with the stacked structures S2, the stacked structures S1 are arranged more densely. In addition, there is a wider gap between the stacked structure S1 in the array region and the stacked structure S2 in the peripheral region. Therefore, the width of the second trench 172 in the direction D1 is greater than the width of the first trench 171 in the direction D1.

Next, several insulating blocks (such as the insulating blocks 211' and 214' in FIG. 1H) are formed on the first dielectric layer 16 and correspondingly on the top surfaces of the stacked structures S1 and S2. FIG. 1C, FIG. 1D, FIG. 1E, FIG. 1F, FIG. 1G and FIG. 1H are cross-sectional views of one applicable method for forming the insulating blocks, in accordance with some embodiments.

Figure 1C:
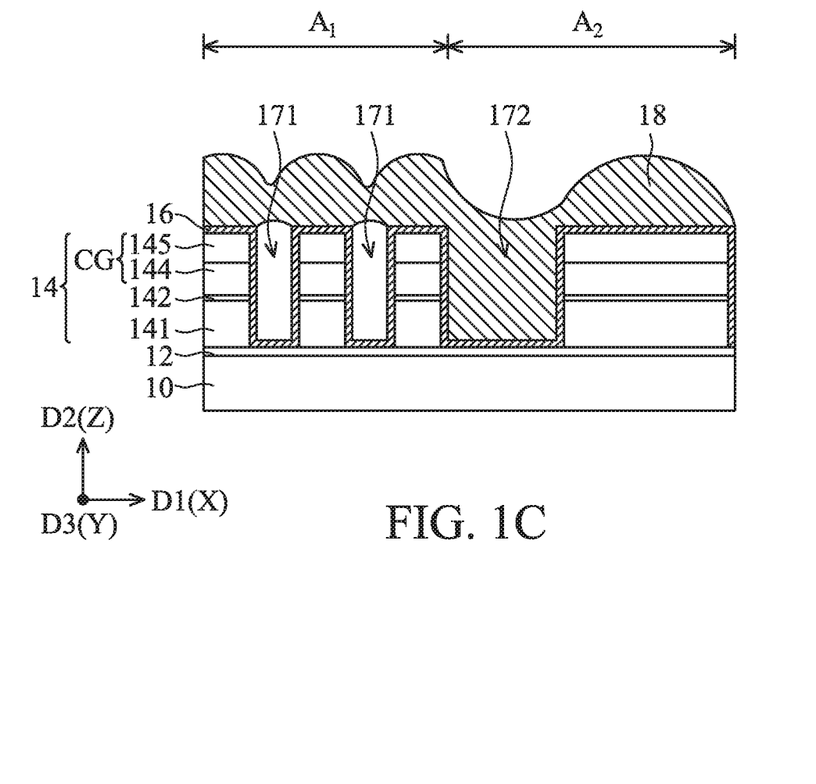

Referring to FIG. 1C, an oxide layer 18 is formed on the dielectric layer 16. For example, the oxide layer 18 can be formed on the dielectric layer 16 by a non-conformal deposition method. According to the above descriptions, the width of the first trench 171 is less than the width of the second trench 17 because the stacked structures S1 are arranged more densely than the stacked structures S2. After the oxide layer 18 is deposited on the dielectric layer 16, the oxide layer 18 is over the first trenches 171 instead of filling in the first trenches 171. However, the larger second trench 172 is filled up with the oxide layer 18.

Figure 1D:
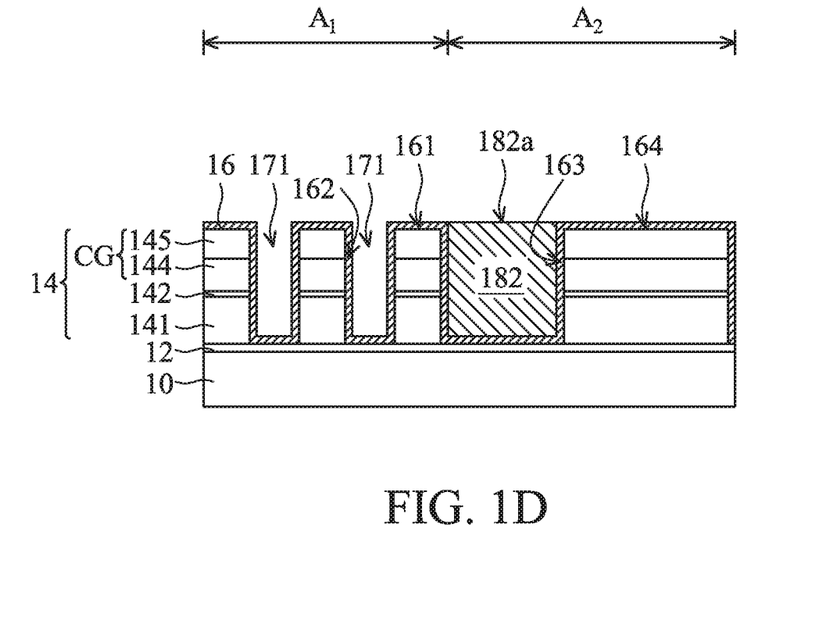

Referring to FIG. 1D, a portion of the oxide layer 18 is removed to expose the dielectric layer 16 and the first trenches 171, wherein the remaining portions of the oxide layer 18 fully fills the second trenches 172. Specifically, the portion of the oxide layer 18 can be removed by chemical mechanical polishing (CMP). After this removing process, the first trenches 171 and the portion of the dielectric layer 16 covering the stacked structures S1 are exposed. The top surface 182a of the remaining portion 182 of the oxide layer 18 in the second trench 172 and the top surface of the fourth portion 164 of the dielectric layer 16 are substantially coplanar. In this embodiment, the dielectric layer 16 functions as a polish stop layer during the removal of the portion of the oxide layer 18.

Figure 1E:
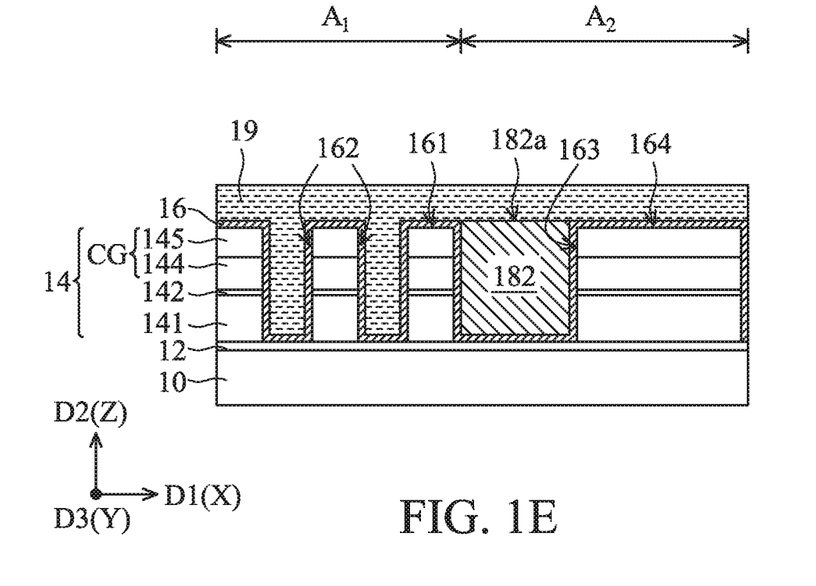

Referring to FIG. 1E, a flowable material 19 is deposited on the dielectric layer 16 and the remaining portion 182 of the oxide layer 18 in the second trench 172. The flowable material 19 fills the first trenches 171. The flowable material 19 is, for example, a material including carbon and oxygen, and has flowable properties. In some embodiments, the flowable material 19 includes an organic dielectric layer (ODL), a spin-on-carbon (SOC), a photo-resist layer, a bottom anti-reflective coating (BARC), a deep UV light absorbing oxide (DUO), one or more other suitable materials. In this embodiment, the flowable material 19 includes an organic dielectric layer (ODL).

Figure 1F:
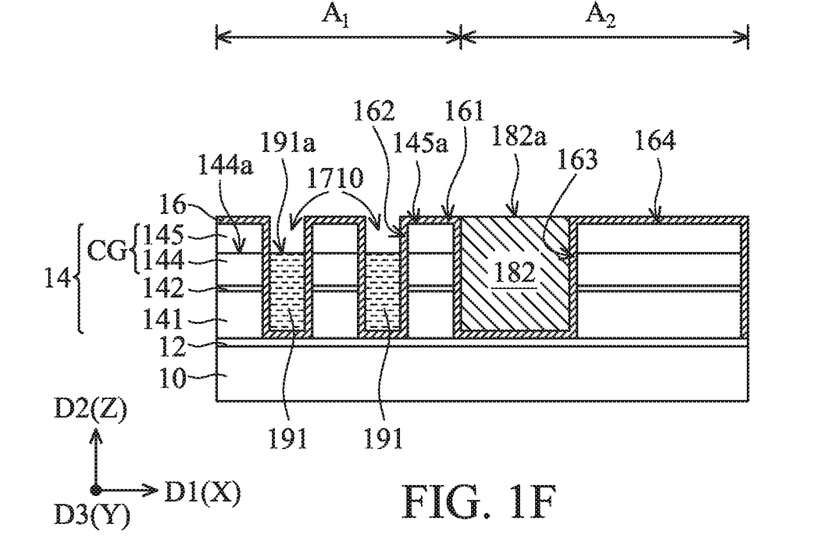

Referring to FIG. 1F, a portion of the flowable material 19 is removed to expose the dielectric layer 16 and the remaining portion 182 of the oxide layer 18 in the second trench 172, wherein the flowable material 19 remained in the first trenches 171 is recessed. As shown in FIG. 1F, after the portion of the flowable material 19 is removed, several recessed portions 1710 are formed on the remaining portions of the flowable material 191 in the first trenches 171. In this embodiment, the recessed portions 1710 expose at least parts of the dielectric layer 16 covering the side surfaces of the stacked structures S1.

In addition, according to some embodiments of the present disclosure, the recessed depth of the flowable material 19 (i.e. the depth of the recessed portions 1710 in the direction D2) should not be too large. If the flowable material 191 in the first trenches 171 has an over-recessed depth, the recessed portions 1710 would be sealed when an insulating material layer is subsequently deposited on the dielectric layer 16. In addition, the recessed depth of the flowable material 19 should not be too small. If the recessed depth of the flowable material 191 in the first trenches 171 is too small, a difference between the thickness of a portion of the insulating material layer over the stacked structures and the thickness of the other portion of the insulating material layer in the recessed portions 1710 would not be sufficient after the insulating material layer subsequently deposited on the dielectric layer 16. If the difference between aforementioned thicknesses is too small, the insulating blocks over the stacked structures would not have sufficient thickness to improve the height of the air gaps between adjacent stacked structures S1 after the flowable material 191 in the first trenches 171 is removed. The numerical value of the recessed depth of the flowable material 19 can be adjusted and determined according to the dimensions (including the depths and widths) of the trenches in the applications.

In some embodiments, after the portion of the flowable material 19 is removed, the top surfaces 191a of the remaining portions of the flowable material 191 in the first trenches 171 are lower than the top surfaces of the stacked structures S1. For example, as shown in FIG. 1F, the top surfaces 191a of the remaining portions of the flowable material 191 in the first trenches 171 are lower than the top surfaces 145a of the metal gates 145 of the stacked structures S1, but not lower than the top surfaces 144a of the polysilicon gates 144 of the stacked structures S1. However, it should be noted that the top surfaces of the remaining portions of the flowable material 191 in the first trenches 171 after the recessed step, in accordance with the embodiments of the present invention, are not limited in the aforementioned position.

Figure 1G:
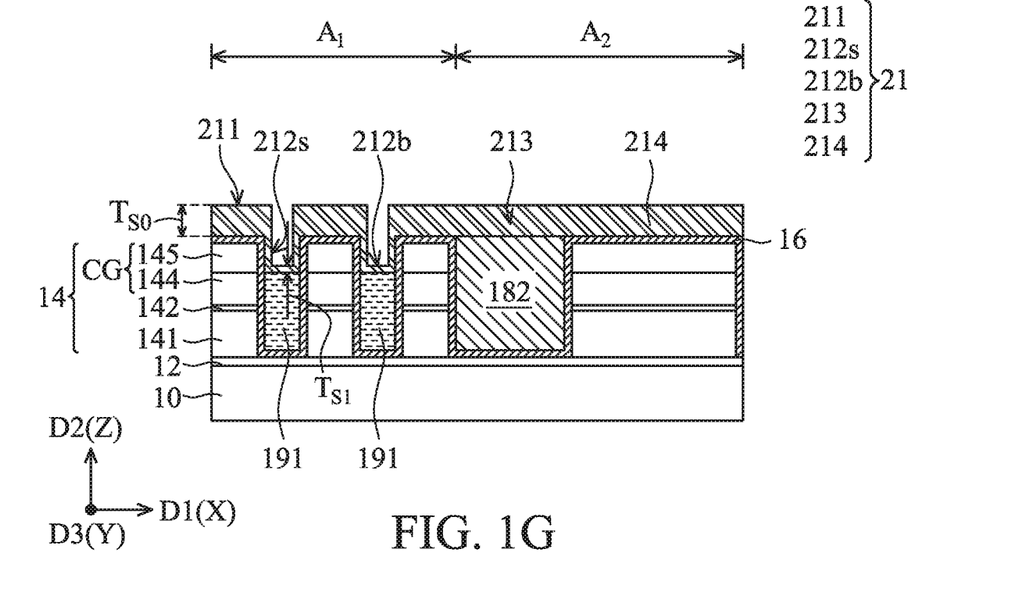

Referring to FIG. 1G, an insulating material layer 21 is formed on the dielectric layer 16, the remaining portion 182 of the oxide layer 18 and the remaining portions of the flowable material 191. The insulating material layer 21 can be conformally deposited on the dielectric layer 16. In this embodiment, the insulating material layer 21 includes the first portions 211, the second portions 212s and 212b, the third portions 213 and the fourth portions 214. The first portions 211 of the insulating material layer 21 are formed over the top surfaces of the stacked structures S1 (such as over the top surfaces 145a of the metal gates 145). The second portions 212s and 212b of the insulating material layer 21 are deposited on the sidewalls and the bottom surfaces of the recessed portions 1710, respectively. The third portions 213 of the insulating material layer 21 are formed on the remaining portion 182 of the oxide layer 18. The fourth portions 214 of the insulating material layer 21 are formed over the top surfaces of the stacked structures S2. In addition, the insulating material layer 21 is, for example, an oxide layer.

In addition, in some embodiments, the stacked structures S1 are arranged more densely than the stacked structures S2, wherein the width of the first trench 171 is less than the width of the second trench 17. Therefore, the thickness of the second portions 212s and 212b of the insulating material layer 21 on the sidewalls and the bottom surfaces of the recessed portions 1710 is less than the thickness of the first portions 211 of the insulating material layer 21 over the stacked structures S1. That is, the thickness $T_{S0}$ (in the direction D2) of the first portions 211 of the insulating material layer 21 is greater than the thickness $T_{S1}$ (in the direction D2) of the second portions 212b of the insulating material layer 21.

Figure 1H:
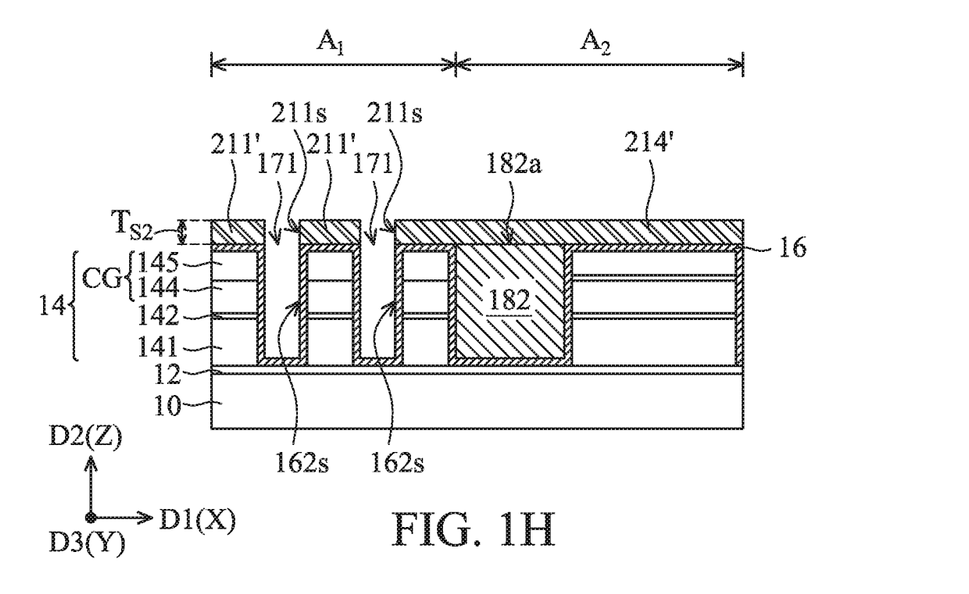

Referring to FIG. 1H, the portions of the insulating material layer 21 and the remaining portions of the flowable material 191 in the first trenches 171 are removed. Specifically, the portions (such as the second portions 212s and 212b on the sidewalls and the bottom surfaces of the recessed portions 1710) of the insulating material layer 21 are removed, and the remaining portions of the flowable material 191 in the first trenches 171 are also removed to expose the first trenches 171. Thus, as shown in FIG. 1H, in some embodiments, several insulating blocks 211' and 214' are formed over the stacked structures S1 and S2, respectively.

In some embodiments, the portions of the insulating material layer 21 and the remaining portions of the flowable material 191 in the first trenches 171 can be removed by a dry etching process. In some embodiments, since the thickness $T_{S0}$ of the first portions 211 of the insulating material layer 21 is much greater than the thickness $T_{S1}$ of the second portions 212b of the insulating material layer 21, the removal of the flowable material 191 can be performed without utilizing a photomask. The removal of the flowable material 191 can be achieved by a self-aligned etching process. As shown in FIG. 1H, after the self-aligned etching process is performed, the thickness $T_{S2}$ of the insulating blocks 211' and 214' is less than the thickness $T_{S0}$ (before self-aligned etching) of the first portions 211 of the insulating material layer 21. However, the insulating blocks 211' and 214' over the stacked structures S1 and S2, in accordance with some embodiments, do increase the heights of the air gaps (between adjacent stacked structures) formed subsequently.

In addition, as shown in FIG. 1H, in some embodiments, the side surfaces 211s of each of the insulating blocks are substantially coplanar with the side surfaces of the dielectric layer 16 after the self-aligned etching process is performed. As shown in FIG. 1H, the side surfaces 211s of each of the insulating blocks 211' are substantially coplanar with the side surfaces 162s of the second portions 162 of the dielectric layer 16.

Figure 1I:
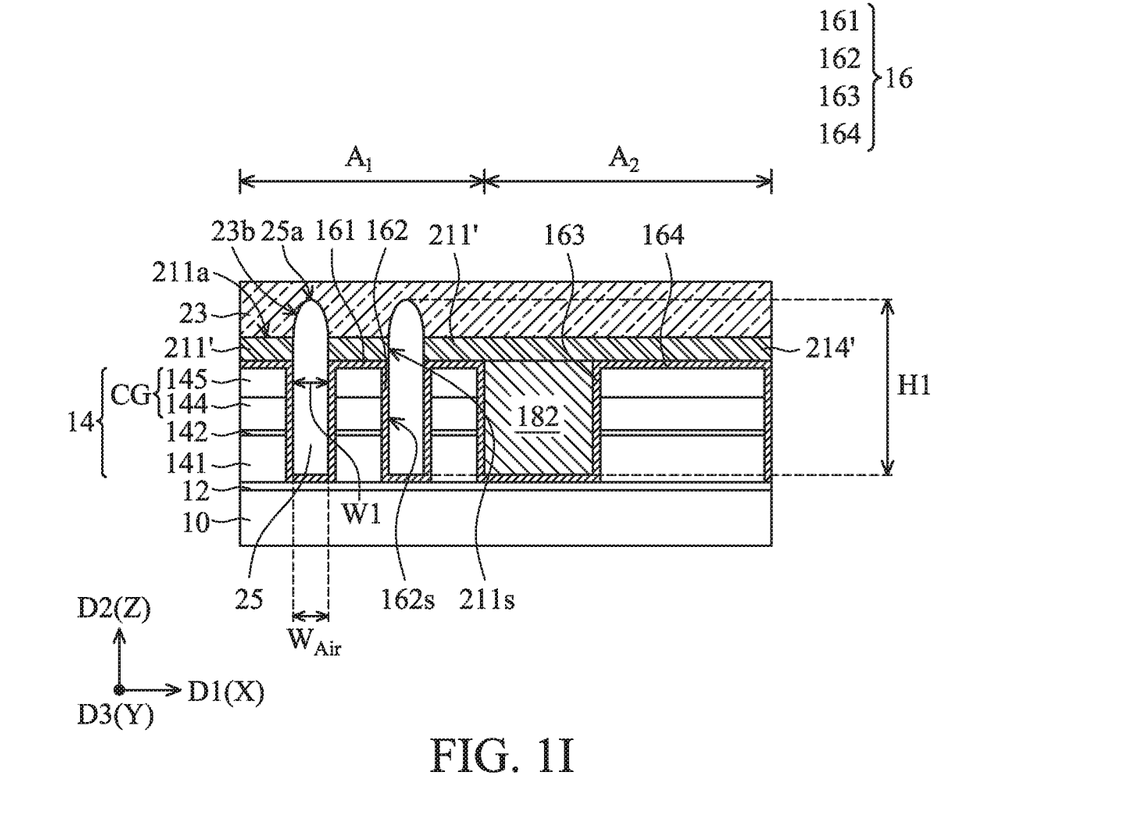

Referring to FIG. 1I, another dielectric layer 23 is formed on the insulating blocks 211' (over the stacked structures S1) and the insulating blocks 214' (over the stacked structures S2), thereby forming several air gaps 25. The dielectric layer 23 covers the air gaps 25 and the insulating blocks 211' and 214'. Specifically, in some embodiments, the spaces between the first trenches 171, the insulating blocks 211' over the stacked structures S1, and the bottom surface 23b of the dielectric layer 23 are filled with the air to form the air gaps 25.

According to some embodiments of the present disclosure, the space between the portions of the dielectric layer 16 (such as the second portions 162 of the dielectric layer 16) on the side surfaces of adjacent stacked structures S1 is fully filled with filled with the air to the air gap 25. In other words, there are only the dielectric layer 16 and the air gap 25 in the respective first trench 171 between adjacent stacked structures S1 (in the direction D1), and no dielectric layer 23 exists in the first trench 171 between adjacent stacked structures S1.

According to some embodiments of the present disclosure, the dielectric layers 23 and 16 include different materials. In this embodiment, the dielectric layer 23 is an oxide layer, and the dielectric layer 16 is a nitride layer. In addition, the dielectric layer 23 and the insulating blocks 211' and 214' include the same material, in accordance with some embodiments. For example, the dielectric layer 23 and the insulating blocks 211' and 214' may include the same oxide.

According to the structure as shown in FIG. 1I, the first trenches 171 between adjacent stacked structures S1 can further extend upward in the direction D2 due to the formation of the insulating blocks 211' and 214' over the stacked structures S1. Thus, the distance between the substrate 10 and the dielectric layer 23 deposited subsequently is increased, thereby increasing the height (in the direction D2) of the air gaps 25 between adjacent stacked structures S1. Accordingly, in some embodiments, the air gaps 25 not only fully fill the spaces (or gaps) between the portions of the dielectric layer 16 (such as the second portions 162 of the dielectric layer 16) on the side surfaces of adjacent stacked structures S1, but also fully fill the spaces between adjacent insulating blocks 211' (over the stacked structures S1). In other words, only the dielectric layer 16 and the air gap 25 exist in the respective first trench 171 between adjacent stacked structures S1 (in the direction D1) and in the spaces (or gaps) between adjacent insulating blocks 211'. The dielectric layer 23 does not exist in the first trenches 171 between adjacent stacked structures S1 and the spaces (or gaps) between adjacent insulating blocks 211'.

As shown in FIG. 1I, the space between the portions of the dielectric layer 16 (such as the second portions 162 of the dielectric layer 16) on the side surfaces of adjacent stacked structures S1 has the width W1 in the direction D1. The air gap 25 has the width $W_{Air}$ in the direction D1. In some embodiments, the width W1 of the aforementioned space is equal to the width $W_{Air}$ of the air gap 25.

In addition, as shown in FIG. 1I, in one embodiment, each of the air gaps 25 exposes at least the portions of the dielectric layer 16 (such as the second portions 162 of the dielectric layer 16) on the side surfaces of the control gates CG of adjacent stacked structures S1. In this embodiment, the air gaps 25 extending in the direction D2 also directly contact the side surfaces of the insulating blocks 211'. Therefore, only the dielectric layer 16 and the air gap 25 exist in the spaces between adjacent insulating blocks 211' along the direction D2. The dielectric layer 23 does not exist in the spaces between adjacent insulating blocks 211', in accordance with some embodiments.

In addition, as shown in FIG. 1I, in some embodiments, the top ends 25a of the air gaps 25 extending in the direction D2 are higher than the top surfaces 211a of the insulating blocks 211'.

In addition, the dielectric layer 23 can be formed by typical deposition method or another suitable deposition method. In some embodiments, the stacked structures S1 over the first region $A_1$ (such as the array region) of the substrate 10 are arranged densely, so as to form the narrow first trenches 171 between the stacked structures S1. Therefore, it is not easy to fill the first trenches 171 with the dielectric layer 23, in accordance with some embodiments.

In some other embodiments, the dielectric layer 23 may include one or more oxides, such as tetraethyl orthosilicate (TEOS). The dielectric layer 23 can be formed by a method of selective deposition. In one example, tetraethyl orthosilicate (TEOS) is deposited on the insulating blocks 211' (over the stacked structures S1) and the insulating blocks 214' (over the stacked structures S2) by chemical vapor deposition (CVD) under a sub-atmospheric pressure (SA) for forming the dielectric layer 23. The process of tetraethyl orthosilicate (TEOS) deposition under a sub-atmospheric pressure (SA) has different deposition rate on the different materials. For example, the TEOS deposition rate on the oxide layer is faster than the TEOS deposition rate on the nitride layer under the sub-atmospheric pressure. The ratio of the deposition rates is, for example, about 2:1. In this embodiment, the insulating blocks 211' are oxide layers, and the dielectric layer 16 on the side surfaces of the stacked structures S1 is a nitride layer. Also, it is not easy to fill the narrow first trenches 171 with the dielectric layer 23. Therefore, after the dielectric layer 23 is deposited, the top ends 25a of the air gaps 25 are higher than the top surfaces 211a of the insulating blocks 211', as shown in FIG. 1I.

In some embodiments, the ratio of the deposition rate of the dielectric layer 23 on the insulating blocks 211' to the deposition rate of the dielectric layer 23 on the dielectric layer 16 is in a range of about 1.5 to about 2.5. For example, the ratio of the deposition rate of the dielectric layer 23 on the insulating blocks 211' to the deposition rate of the dielectric layer 23 on the dielectric layer 16 is about 2.

According to some embodiments of the present disclosure, the formation of the insulating blocks 211' and 214' (as shown in FIG. 1H) makes the first trenches 171 between adjacent stacked structures S1 further extend upward in the direction D2, thereby increasing the distance between the substrate 10 and the dielectric layer 23 (as shown in FIG. 1I). Thus, the heights (in the direction D2) of the air gaps 25 between adjacent stacked structures S1 can be increased. Also, in some embodiments, the recessed depths of flowable material 19 in the respective first trenches 17 can be same, and the insulating blocks 211' and 214' having the same thickness can be consequently formed over the stacked structures. Thus, the uniformity of the heights and the profiles of the air gaps consequently formed between the stacked structures can be controlled, thereby improving the reliability of the non-volatile memory structure during operation. In some embodiments, the air gaps 25 are the same height in the direction D2 (such as Z direction).

FIG. 2A-FIG. 2F are cross-sectional views of various stages of manufacturing a non-volatile memory structure in accordance with some other embodiments of the present invention. FIG. 2A-FIG. 2F show another manufacturing process following the step of FIG. 1G. In addition, the features/components in FIG. 2A-FIG. 2F identical to those in FIG. 1A-FIG. 1I are designated by the same or similar reference numbers for clarity of illustration.

Figure 2A:
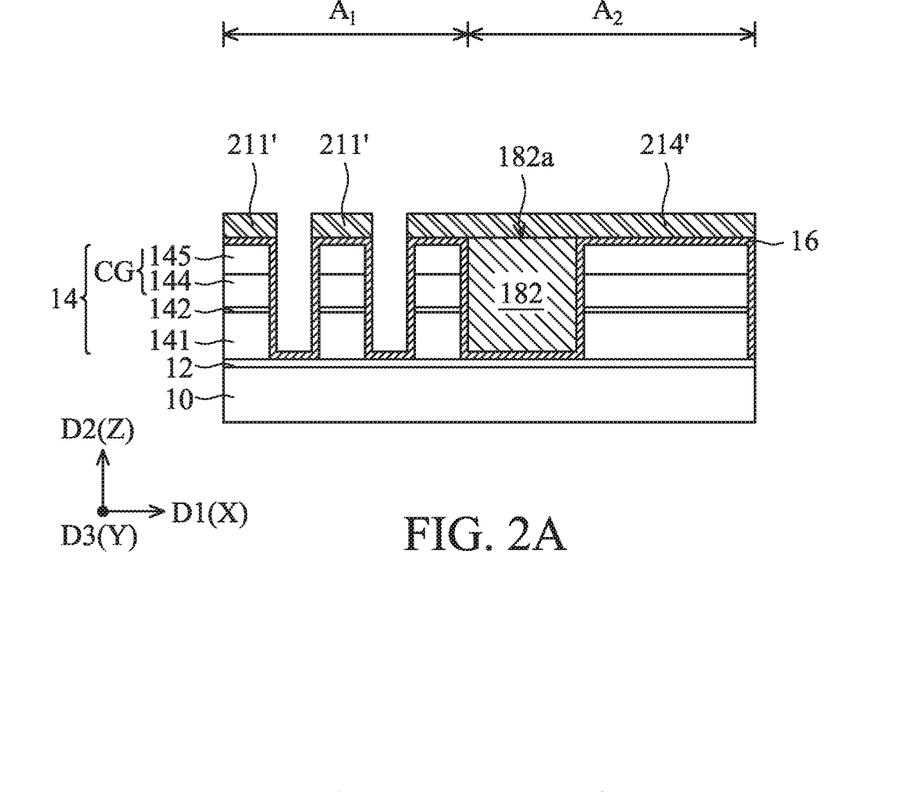
FIG. 2A-FIG. 2F are cross-sectional views of various stages of manufacturing a non-volatile memory structure in accordance with some other embodiments of the present invention, which show another manufacturing process following the step of FIG. 1G.

The forming method of the features/components and the structure in FIG. 2A are identical to those in FIG. 1H and have been described above. Those details are not redundantly repeated herein for the sake of simplicity and clarity. Also, the insulating blocks 211' and 214' formed on the respective stacked structures S1 and S2 according to the aforementioned manufacturing method can be referred to as the first insulating layers 211' and 214' in the following descriptions.

Figure 2B:
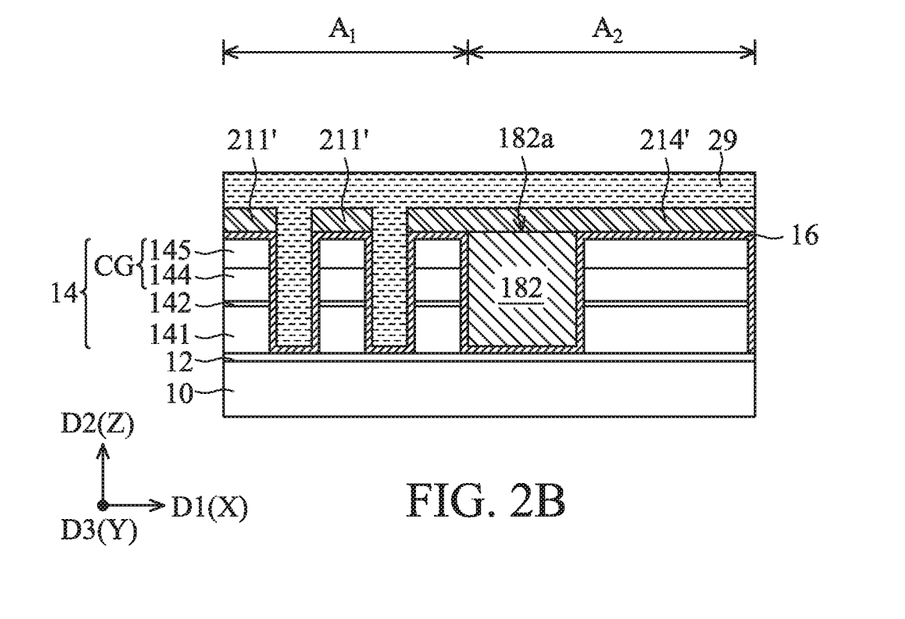

Referring to FIG. 2B, in some embodiments, another flowable material 29 is further deposited on the first insulating layers 211' and 214'. The flowable materials 19 and 29 may include the same material. Also, the material and deposition method of the flowable material 29 are identical to those of the flowable material 19 and have been described above. Therefore, those details are not redundantly repeated herein.

Figure 2C:
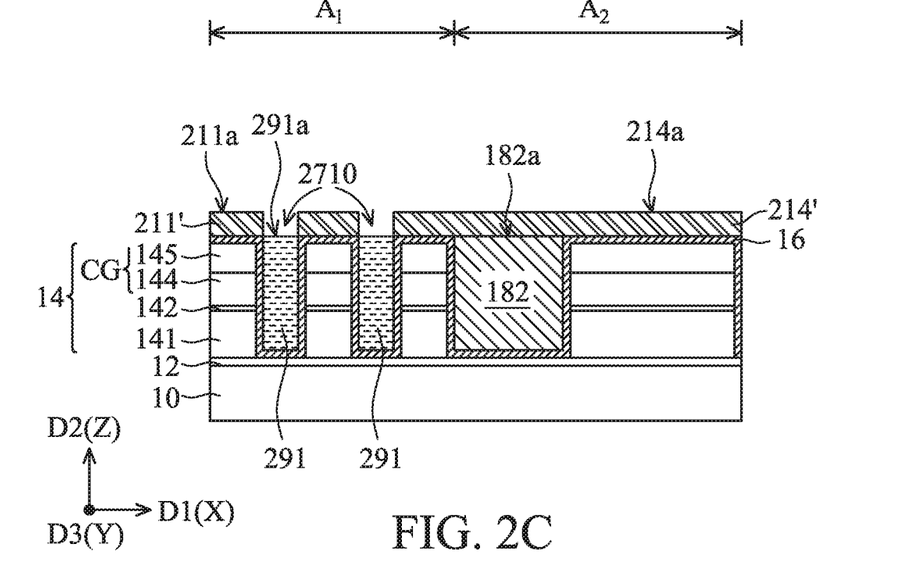

Referring to FIG. 2C, in some embodiments, a portion of the flowable material 29 is removed to expose the first insulating layers 211' and 214', wherein the flowable material 29 corresponding to the first trenches 171 is recessed. As shown in FIG. 2C, after the portion of the flowable material 29 is removed, several recessed portions 2710 are formed on the remaining portions of the flowable material 291 in the first trenches 171.

In some embodiments, after the portion of the flowable material 29 is removed, the top surfaces 291a of the remaining portions of the flowable material 291 in the first trenches 171 are lower than the top surfaces 211a and 214a of the respective first insulating layers 211' and 214'. As shown in FIG. 2C, the recessed portions 2710 expose the side surfaces of the first insulating layers 211' and 214'. However, the recessed depth of the flowable material 29 can be adjusted and determined according to the dimensions (including the depths and widths) of the trenches in the applications, and is not limited to the disclosed embodiment.

Figure 2D:
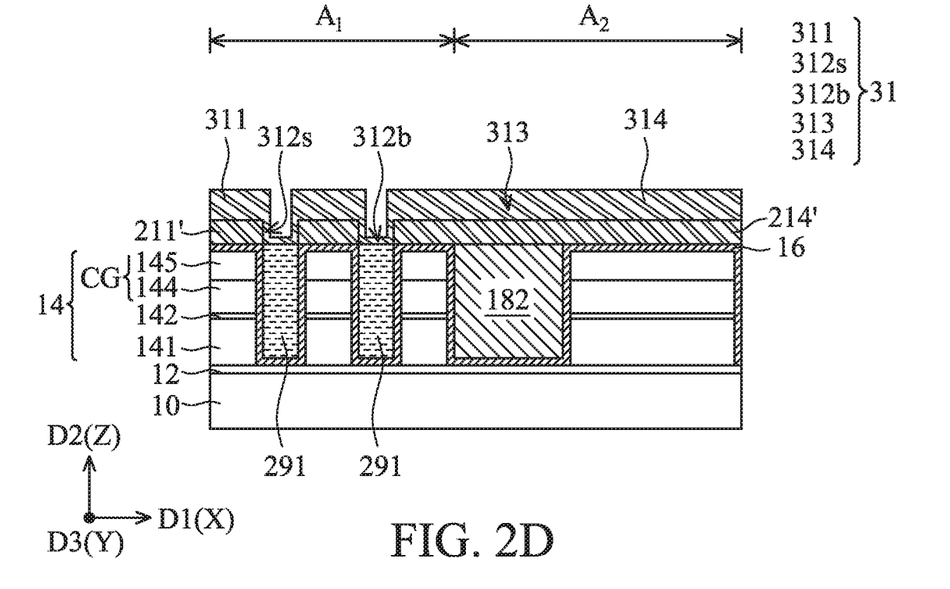

Referring to FIG. 2D, in some embodiments, another insulating material layer 31 is formed on the first insulating layers 211' and 214', the remaining portion 182 of the oxide layer 18 and the remaining portions of the flowable material 291. In this embodiment, the insulating material layer 31 can be deposited conformally. The insulating material layer 31 is, for example, an oxide layer. In addition, the insulating material layers 31 and 21 may include the same or different materials. The insulating material layers 31 and 21 may include the same or different thicknesses. The materials and thicknesses of the insulating material layers 31 and 21 can be determined based on the conditions in the applications.

As shown in FIG. 2D, in this embodiment, the insulating material layer 21 includes the first portions 311, the second portions 312s and 312b, the third portions 313 and the fourth portions 314. The first portions 311 of the insulating material layer 31 are formed over the top surfaces of the first insulating layers 211'. The second portions 312s and 312b of the insulating material layer 31 are deposited on the sidewalls and the bottom surfaces of the recessed portions 2710, respectively. The third portions 313 of the insulating material layer 31 are formed on the remaining portion 182 of the oxide layer 18. The fourth portions 314 of the insulating material layer 31 are formed over the top surfaces of the first insulating layers 211'.

Figure 2E:
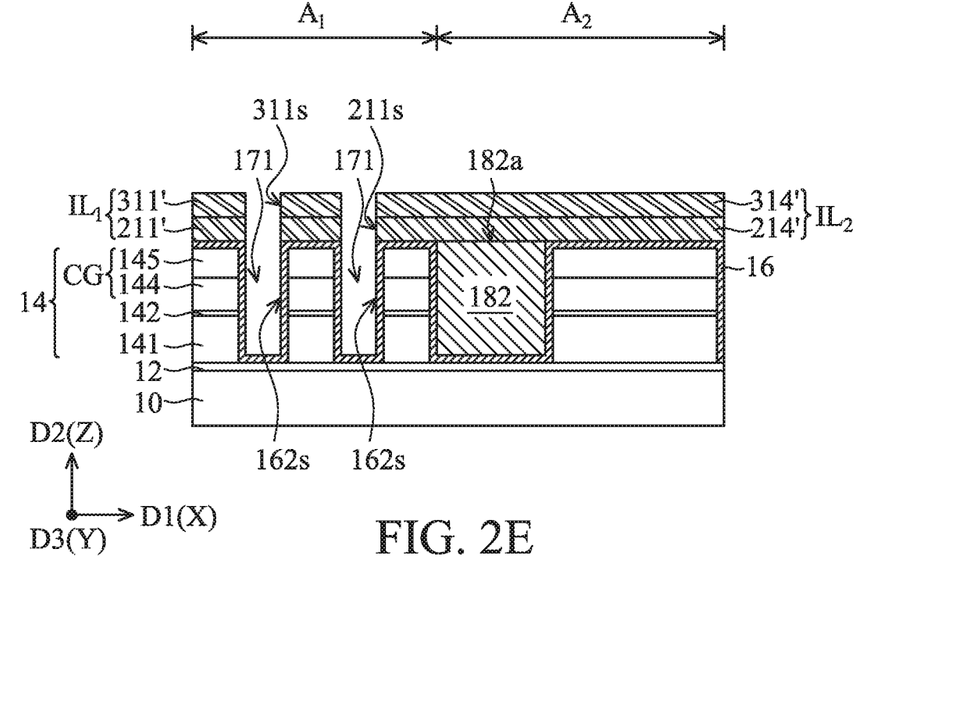

Referring to FIG. 2E, in some embodiments, the portions of the insulating material layer and the flowable material in the first trenches 171 are removed. Specifically, the second portions 312s and 312b (on the sidewalls and the bottom surfaces of the recessed portions 2710) of the insulating material layer 31 are removed, and the remaining portions of the flowable material 291 in the first trenches 171 are also removed to expose the first trenches 171. Therefore, the second insulating blocks 311' and 314' are formed over the first insulating layers 211' and 214', respectively. As shown in FIG. 2E, in some embodiments, the first insulating layers 211' and the second insulating blocks 311' over the stacked structures S1 collectively form the insulating blocks IL$_1$. Similarly, the first insulating layers 214' and the second insulating blocks 314' over the stacked structures S2 collectively form the insulating blocks IL$_2$. Accordingly, the insulating blocks, each containing two insulating layers, are formed on the stacked structures.

Similar to the aforementioned manufacturing method, the method in this embodiment includes the step of removing the insulating material layer and the flowable material 291 in the first trenches 171 without utilizing a photomask. For example, the removal of the insulating material layer and the flowable material 291 can be achieved by a self-aligned etching process. After the self-aligned etching process is performed, the side surfaces of each of the insulating blocks are substantially coplanar with the side surfaces of the dielectric layer 16. As shown in FIG. 2E, the side surfaces 211s of the first insulating layers 211' and the side surfaces 311s of the second insulating layers 311' of the insulating blocks IL$_1$ are substantially coplanar with the side surfaces 162s of the dielectric layer 16, in accordance with some embodiments.

Figure 2F:
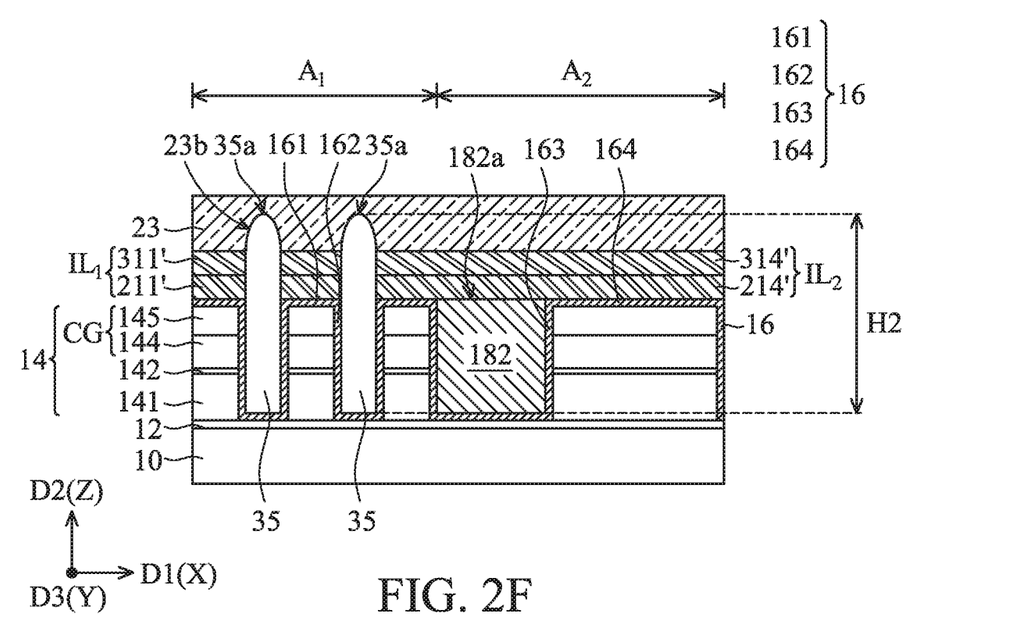

Referring to FIG. 2F, in some embodiments, the dielectric layer 23 is formed on the second insulating layers 311' (corresponding to the stacked structures S1) and 314' (corresponding to the stacked structures S2), thereby forming several air gaps 35. The dielectric layer 23 can be formed by typical deposition method or another suitable deposition method. For example, the dielectric layer 23 can be formed by a method of selective deposition under a sub-atmospheric pressure (SA). The method of selective deposition under a sub-atmospheric pressure has been described above, and the details are not redundantly repeated herein.

In some embodiment, each of the air gaps 35 extending in the direction D2 directly contacts the side surfaces of the first insulating layer 211' and the second insulating layer 311' of each of the insulating blocks. As shown in FIG. 2F, the air gaps 35 fully fill the spaces (or gaps) between the portions of the dielectric layer 16 (such as the second portions 162 of the dielectric layer 16) on the side surfaces of adjacent stacked structures S1, and the spaces between adjacent first insulating layers 211' (over the stacked structures S1). Also, the air gaps 35 fully fill the spaces (or gaps) between adjacent second insulating layers 311' (over the stacked structures S1), in accordance with some embodiments. In other words, only the dielectric layer 16 and the air gap 35 exist in the spaces (along the direction D1) between adjacent stacked structures S1, between adjacent first insulating layers 211' and between adjacent second insulating layers 311'. The dielectric layer 23 does not exist in the spaces (along the direction D1) between adjacent stacked structures S1, between adjacent first insulating layers 211' and between adjacent second insulating layers 311'.

According to the aforementioned method as shown in FIG. 2A to FIG. 2E, the insulating blocks IL$_1$ (such as the insulating blocks IL$_1$ and IL$_2$ as shown in FIG. 2E) can be obtained, wherein each of the insulating blocks has a multilayer structure. Also, each of the insulating blocks includes several insulating layers stacked vertically in the direction D2. In addition, depending on the actual process requirements, the steps as shown in FIG. 2A to FIG. 2E can be repeated to produce several insulating blocks, and each of the insulating blocks includes three or more insulating layers.

Referring to the air gaps 25 in FIG. 1I and the air gaps 35 in FIG. 2F, the air gaps 35 have the height H2 in the direction D2, and the air gaps 25 have the height H1 in the direction D2. The height H2 of the air gaps 35 is greater than the height H1 of the air gaps 25 (H2>H1). Thus, the height of the air gaps in the direction D2 can be significantly increased by forming the insulating blocks with a greater thickness or containing more insulating layers, in accordance with some embodiments.

According to the aforementioned descriptions, the non-volatile memory structures and methods of manufacturing the same, in accordance with some embodiments, have several advantages. For example, the insulating blocks each having a single layer structure or a multilayer structure can be formed over the stacked structures though simple processes, and no extra production cost is required in the manufacturing method of the embodiments. Also, the formation of the insulating blocks significantly increases the heights of the air gaps 25/35 between adjacent stacked structures (such as the word line gate structures). The thickness of the insulating blocks and/or the number of the insulating layers of the insulating blocks can be determined and varied, depending on the height of the air gaps to be formed. Also, the manufacturing method of the embodiment includes recessing the flowable material in the trenches (such as the first trenches) between adjacent stacked structures by the same depth. The insulating blocks with the same thickness can be consequently formed over the stacked structures. Thus, the uniformity of the heights and the profiles of the air gaps 25/35 consequently formed between the stacked structures can be controlled, thereby improving the reliability of the non-volatile memory structure during operation. Furthermore, according to the manufacturing method of the embodiment, the removal of the flowable material in the first trenches can be achieved by a self-aligned etching process without utilizing a photomask. Therefore, the air gaps 25/35 having the sufficient width can be formed after the dielectric layer 23 is deposited. In some embodiments, there are only the dielectric layer 16 (such as a nitride layer) and the air gaps 25/35 in the spaces (or gaps) between adjacent stacked structures (such as the word line gate structures). In some other embodiments, there are still only the dielectric layer 16 and the air gaps 25/35 in the spaces (or gaps) between adjacent insulating blocks. That is, the dielectric layer 23 (such as an oxide layer) does not exist in the spaces (along the direction D1) between adjacent stacked structures, and even does not exist in the spaces between adjacent insulating blocks. Accordingly, the degree of electrical isolation between adjacent stacked structures (such as word line gate structures) can be improved, thereby reducing the leakage current and the coupling capacitance of the non-volatile memory structure. The non-volatile memory structures of the embodiments do improve the reliability of the structure during operation, thereby increasing the yield and the reliability of the final products applied with the structure of the embodiments.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory structure, comprising:
 a substrate having an array region and a peripheral region;
 a tunnel dielectric layer on the substrate;
 gate structures over the array region of the substrate, wherein the gate structures are separate from each other, and each of the gate structures includes a floating gate and a control gate above the floating gate;
 a stacked structure on the substrate and in the peripheral region of the substrate, wherein the stacked structure is adjacent to the array region, and a distance between the stacked structure and the gate structure closest to the peripheral region among the gate structures is greater than a distance between two adjacent gate structures;
 a first dielectric layer formed above the substrate and covering a top surface of the tunnel dielectric layer, wherein the first dielectric layer covers side surfaces and top surfaces of the gate structures and further covers side surfaces and a top surface of the stacked structure, and wherein spaces between portions of the first dielectric layer on the side surfaces of two adjacent gate structures are fully filled with the air to form respective air gaps;

insulating blocks above the first dielectric layer, wherein each of the insulating blocks corresponds to one of the gate structures; and a second dielectric layer on the insulating blocks, wherein the second dielectric layer covers the insulating blocks and the air gaps.

2. The non-volatile memory structure as claimed in claim 1, wherein top ends of the air gaps are higher than top surfaces of the insulating blocks.

3. The non-volatile memory structure as claimed in claim 1, wherein the air gaps expose at least portions of the first dielectric layer on side surfaces of the control gates of each of the gate structures.

4. The non-volatile memory structure as claimed in claim 1, wherein the air gaps directly contact side surfaces of the insulating blocks.

5. The non-volatile memory structure as claimed in claim 1, wherein the air gaps are the same height in a direction that is vertical to the substrate.

6. The non-volatile memory structure as claimed in claim 1, wherein each of the insulating blocks is separated from the control gate of each of the gate structures by the first dielectric layer.

7. The non-volatile memory structure as claimed in claim 1, wherein a side surface of each of the insulating blocks is aligned with a side surface of the first dielectric layer.

8. The non-volatile memory structure as claimed in claim 1, wherein the control gate of each of the gate structures includes a polysilicon gate and a metal gate on the polysilicon gate, wherein each of the insulating blocks is separated from the metal gate of corresponding one of the gate structures by the first dielectric layer.

9. A method of manufacturing a non-volatile memory structure, comprising:

providing a substrate having a first region and a second region;

forming a tunnel dielectric layer on the substrate;

forming first stacked structures and second stacked structures separately above the tunnel dielectric layer, wherein the first stacked structures and the second stacked structures are respectively formed in the first region and the second region;

forming a first dielectric layer above the substrate, wherein the first dielectric layer covers a top surface of the tunnel dielectric layer, the first dielectric layer covers side surfaces and top surfaces of each of the first stacked structures and each of the second stacked structures, wherein after the first dielectric layer is formed, there are first trenches between adjacent first stacked structures, and a second trench is between the adjacent first stacked structure and the second stacked structure, wherein a width of the second trench in a first direction is greater than a width of each of the first trenches in the first direction;

forming a plurality of insulating blocks above the first dielectric layer, wherein the insulating blocks are formed over the top surface of each of the first stacked structures and each of the second stacked structures; and forming a second dielectric layer over the first stacked structures and the second stacked structures to form air gaps, wherein the second dielectric layer covers the insulating blocks and the air gaps, and spaces between portions of the first dielectric layer on the side surfaces of two adjacent first stacked structures are fully filled with the air to form the air gaps.

10. The method of manufacturing the non-volatile memory structure as claimed in claim 9, wherein spaces between the insulating blocks over adjacent first stacked structures are also fully filled with air to form the air gaps, and top ends of the air gaps are higher than top surfaces of the insulating blocks.

11. The method of manufacturing the non-volatile memory structure as claimed in claim 9, wherein after the first dielectric layer is formed and before the insulating blocks are formed, the method further comprises:

depositing an oxide layer on the first dielectric layer, wherein the oxide layer is over the first trenches but fully fills the second trenches;

removing a portion of the oxide layer to expose the first dielectric layer and the first trenches, wherein remaining portions of the oxide layer fully fill the second trenches;

depositing a flowable material on the first dielectric layer and the remaining portions of the oxide layer in the second trenches, wherein the flowable material fully fills the first trenches; and removing a portion of the flowable material to recess the flowable material in the first trenches.

12. The method of manufacturing the non-volatile memory structure as claimed in claim 11, wherein after the portion of the flowable material is removed, recessed portions are formed on respective remaining portions of the flowable material in the first trenches, wherein the recessed portions expose at least parts of the first dielectric layer covering the side surfaces of the first stacked structures, and top surfaces of the remaining portions of the flowable material in the first trenches are lower than the top surfaces of the first stacked structures.

13. The method of manufacturing the non-volatile memory structure as claimed in claim 11, wherein each of the first stacked structures includes a floating gate and a control gate above the floating gate, and the control gate includes a polysilicon gate and a metal gate on the polysilicon gate, wherein top surfaces of the remaining portions of the flowable material in the first trenches are not lower than top surfaces of the polysilicon gates of the first stacked structures after the portion of the flowable material is removed.

14. The method of manufacturing the non-volatile memory structure as claimed in claim 11, wherein after the portion of the flowable material is removed, the method further comprises:

forming an insulating material layer on the first dielectric layer, the remaining portions of the oxide layer and the remaining portions of the flowable material;

removing portions of the insulating material layer and the remaining portions of the flowable material in the first trenches, so as to expose the first trenches and form the insulating blocks above the first stacked structures and second stacked structures; and depositing the second dielectric layer.

* * * * *